United States Patent
Wada

(10) Patent No.: US 6,682,948 B2
(45) Date of Patent: Jan. 27, 2004

(54) SEMICONDUCTOR DEVICE AND METHOD FOR MANUFACTURING THE SAME

(75) Inventor: Kenji Wada, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 141 days.

(21) Appl. No.: 09/891,407

(22) Filed: Jun. 27, 2001

(65) Prior Publication Data

US 2002/0025587 A1 Feb. 28, 2002

(30) Foreign Application Priority Data

Jun. 27, 2000 (JP) ........................................ 2000-192539

(51) Int. Cl.[7] .......................... G01R 31/26; H01L 21/66
(52) U.S. Cl. ........................ 438/17; 438/14; 438/15
(58) Field of Search ............................ 438/14, 15, 17, 438/108

(56) References Cited

U.S. PATENT DOCUMENTS

| | | | |
|---|---|---|---|
| 4,696,885 A | | 9/1987 | Vijan |
| 5,918,113 A | * | 6/1999 | Higashi et al. ............ 438/119 |
| 6,114,192 A | * | 9/2000 | Tsunoda et al. ........... 438/126 |
| 6,333,564 B1 | * | 12/2001 | Katoh et al. .............. 257/780 |
| 6,358,762 B1 | * | 3/2002 | Kohno et al. ............... 438/17 |
| 6,358,836 B1 | * | 3/2002 | Lu et al. .................... 438/618 |
| 6,388,313 B1 | * | 5/2002 | Lee et al. ................... 257/686 |

FOREIGN PATENT DOCUMENTS

| | | | | |
|---|---|---|---|---|
| JP | A 5-206286 | 8/1993 | | |
| JP | A 8-83881 | 3/1996 | | |
| JP | 40-9153516 | * 6/1997 | | H01L/21/60 |
| JP | A 10-223833 | 8/1998 | | |

* cited by examiner

Primary Examiner—Amir Zarabian
Assistant Examiner—Pamela E Perkins
(74) Attorney, Agent, or Firm—Oliff & Berridge, PLC

(57) ABSTRACT

The invention simplifies the manufacturing processes and increases the yield. A semiconductor wafer equipped with a plurality of semiconductor chip forming sections is prepared. An electrical characteristic examination is conducted for each of the semiconductor chip forming sections to determine good product sections or bad product sections. At least another segmented semiconductor chip is electrically connected to each of the semiconductor chip forming sections that are determined to be good product sections.

16 Claims, 10 Drawing Sheets

9: Segmented other semiconductor chips

3: Semiconductor chip forming section
5: Semiconductor wafer

3a: "BAD" mark

9: Segmented other semiconductor chips

6b: Segmented another semiconductor chip
300: Semiconductor device

SEMICONDUCTOR DEVICE AND METHOD FOR MANUFACTURING THE SAME

BACKGROUND OF THE INVENTION

1. Field of Invention

The present invention relates to a three-dimensional mounting type of semiconductor device and a method for manufacturing the same.

2. Description of Related Art

In recent years, three-dimensional mounting type semiconductor devices, in which a plurality of semiconductor devices are stacked in layers, have been developed. Conventionally, the three-dimensional mounting type semiconductor devices include those in which semiconductor chips, that have been individually cut from semiconductor wafers, are stacked in layers, or those in which semiconductor wafers having chip-forming sections are bonded together and then cut into individual segments.

However, in the former case in which semiconductor chips that have been individually cut from semiconductor wafers are stacked in layers, for example, positional alignment of the base semiconductor chips or the like is required, whereby the number of process steps is unavoidably increased.

Also, in the latter case in which semiconductor wafers having chip-forming sections are bonded together and then cut into individual segments, the semiconductor wafers to be bonded may include bad semiconductor chip forming sections. Even though locations of the bad semiconductor chip forming sections can be determined, it is unavoidable that the bad semiconductor chip forming sections are bonded because the semiconductor wafers are bonded together. Accordingly, after the semiconductor chip forming sections are bonded together and cut into individual segments, the bad products must be separated from the good products. When the bad semiconductor chip forming sections are present in one of the semiconductor wafers to be bonded, bonded segments become bad products, and therefore the yield is unavoidably deteriorated.

SUMMARY OF THE INVENTION

It is therefore an object of the present invention to simplify the manufacturing process and increase the yield.

A method for manufacturing a semiconductor device in accordance with a first aspect of the invention includes the steps of: preparing a semiconductor wafer equipped with a plurality of semiconductor chip forming sections; conducting an electrical characteristic examination for each of the semiconductor chip forming sections to determine good product sections or bad product sections; and electrically connecting at least another segmented semiconductor chip to each of the semiconductor chip forming sections that are determined to be good product sections.

In the invention described above, another segmented semiconductor chip is electrically connected only to each of the semiconductor chip forming sections that are determined to be good product sections. Therefore, other segmented semiconductor chips are not stacked in layers on bad semiconductor chip forming sections, which reduces waste and increases the yield. Also, since the other segmented semiconductor chips are stacked in layers on the semiconductor wafer before the semiconductor chip forming sections thereof are cut into segments, the manufacturing process is simplified.

In the method for manufacturing a semiconductor device in accordance with a second aspect of the present invention, the segmented semiconductor chip of the first aspect, that has been previously subject to an electrical characteristic examination and determined to be a good product, is used.

In the method for manufacturing a semiconductor device in accordance with a third aspect of the present invention, an electrical connection between at least another segmented semiconductor chip and each of the semiconductor chip forming sections that are determined to be good product sections in the first and second aspects may be conducted by wire bonding.

In the method for manufacturing a semiconductor device in accordance with a forth aspect of the present invention, an electrical connection between at least another segmented semiconductor chip and each of the semiconductor chip forming sections that are determined to be good product sections in the first and second aspects may be conducted by face-down bonding.

In the method for manufacturing a semiconductor device in accordance with a fifth aspect of the present invention, when electrically connecting another segmented semiconductor chip to each of the semiconductor chip forming sections that are determined to be good product sections in the first and second aspects, two or more other segmented semiconductor chips may be prepared, the electrical connection of the at least another segmented semiconductor chip may be conducted by wire bonding, and the electrical connection of the other remaining segmented semiconductor chips may be conducted by face-down bonding.

The method for manufacturing a semiconductor device in accordance with a sixth aspect of the present invention may include, after electrically connecting the segmented other semiconductor chips to the respective semiconductor chip forming sections in the third through fifth aspects, the step of protecting at least connecting sections between the other segmented semiconductor chips and the respective semiconductor chip forming sections with a resin mold.

The method for manufacturing a semiconductor device in accordance with a seventh aspect of the present invention may include the step of cutting the semiconductor wafer in which the segmented semiconductor chips are electrically connected in the first through sixth aspects into segments for the respective semiconductor chip forming sections.

A method for manufacturing a semiconductor device in accordance with an eighth aspect of the present invention includes the steps of: preparing a semiconductor wafer equipped with a plurality of semiconductor chip forming sections having electrodes; forming a through hole in each of the semiconductor chip forming sections, and forming a conduction layer that extends via the through hole, from at least one surface of the semiconductor chip forming sections on which the electrodes are formed, to the other surface opposing to the one surface; conducting an electrical characteristic examination for each of the semiconductor chip forming sections to determine good product sections or bad product sections; and electrically connecting at least another segmented semiconductor chip to each of the semiconductor chip forming sections that are determined to be good product sections.

In the embodiment of the eighth aspect, in the semiconductor wafer having a conduction layer formed to extend from at least one surface of the semiconductor chip forming sections on which the electrodes are formed to the other surface opposing to the one surface, other segmented semiconductor chips are stacked in layers on and electrically connected to only the semiconductor chip forming sections that are determined to be good product sections. As a result, a high electrical reliability is attained, the other segmented semiconductor chips are not stacked in layers on bad semiconductor chip forming sections, such waste is reduced and the yield is increased. Also, since the other segmented semiconductor chips are stacked in layers on the semiconductor wafer before the semiconductor chip forming sections thereof are cut into segments, the manufacturing process is simplified.

In the method for manufacturing a semiconductor device in accordance with a ninth aspect of the present invention, the segmented semiconductor chip in the eighth aspect, that has been previously subject to an electrical characteristic examination and determined as a good product, is used.

In the method for manufacturing a semiconductor device in accordance with a tenth aspect of the present invention, an electrical connection between at least another segmented semiconductor chip and each of the semiconductor chip forming sections that are determined to be good product sections in the eighth and ninth aspects may be conducted by wire bonding.

In the method for manufacturing a semiconductor device in accordance with an eleventh aspect of the present invention, an electrical connection between at least another segmented semiconductor chip and each of the semiconductor chip forming sections that are determined to be good product sections in the eighth and ninth aspects may be conducted by face-down bonding.

In the method for manufacturing a semiconductor device in accordance with a twelfth aspect of the present invention, when electrically connecting another segmented semiconductor chip to each of the semiconductor chip forming sections that are determined to be good product sections in the eighth and ninth aspects, two or more other segmented semiconductor chips may be prepared, the electrical connection of the at least another segmented semiconductor chip may be conducted by wire bonding, and the electrical connection of the other remaining segmented semiconductor chips may be conducted by face-down bonding.

The method for manufacturing a semiconductor device in accordance with a thirteenth aspect of the present invention may include, after electrically connecting the segmented other semiconductor chips to the respective semiconductor chip forming sections in the tenth through twelfth aspects, the step of protecting at least connecting sections between the other segmented semiconductor chips and the respective semiconductor chip forming sections with a resin mold.

The method for manufacturing a semiconductor device in accordance with a fourteenth aspect of the present invention may include the step of cutting the semiconductor wafer in which the segmented semiconductor chips are electrically connected in the eighth through thirteenth aspects into segments for the respective semiconductor chip forming sections.

In the method for manufacturing a semiconductor device in accordance with a fifteenth aspect of the present invention, after a stress relieving layer is formed on at least one surface of the semiconductor chip forming sections in the eighth through fourteenth aspects, the conduction layer may be formed over the stress-relieving layers.

In the method for manufacturing a semiconductor device in accordance with a sixteenth aspect of the present invention, external electrodes may be formed on the conduction layers in the semiconductor chip forming sections in the eighth through fourteenth aspects.

A semiconductor device in accordance with a seventeenth aspect of the present invention includes a semiconductor wafer equipped with a plurality of semiconductor chip forming sections has at least one of the semiconductor chip forming sections being electrically connected to at least another segmented semiconductor chip.

In the semiconductor device in accordance with an eighteenth aspect of the present invention, the semiconductor chip forming section being electrically connected to the another segmented semiconductor chip in the semiconductor wafer in the seventeenth aspect has previously been subject to an electrical characteristic examination and determined as a good product.

In the seventeenth and eighteenth aspects, other segmented semiconductor chips are stacked in layers only on and electrically connected only to the semiconductor chip forming sections that have previously been subject to an electrical characteristic examination and determined as good products. As a result, other segmented semiconductor chips are not stacked in layers on bad semiconductor chip forming sections, such that waste is reduced and the yield is increased.

A semiconductor device in accordance with a nineteenth aspect of the present invention includes a semiconductor wafer equipped with a plurality of semiconductor chip forming sections having electrodes, a through hole is defined by each of the semiconductor chip forming sections, and a conduction layer extends via the through hole from at least one surface of the semiconductor chip forming sections, on which the electrodes are formed, to the other surface opposing the one surface. At least another segmented semiconductor chip is electrically connected to each of the semiconductor chip forming sections of the semiconductor wafer.

In the semiconductor device in accordance with a twentieth aspect of the present invention, the other segmented semiconductor chip in the nineteenth aspect may be electrically connected to the semiconductor chip forming section through the conduction layer.

DETAILED DESCRIPTION OF PREFERRED EMBODIMENTS

Embodiment 1

The present invention is described below with reference to various embodiments.

Figure 1:
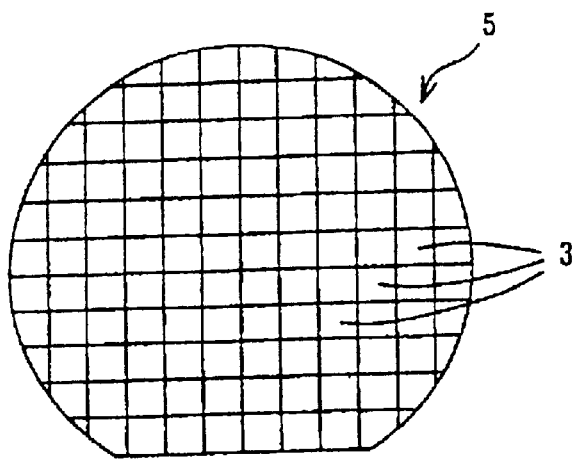
FIG. 1 is a plan view of a semiconductor wafer having a plurality of semiconductor chip forming sections, which presents a basis to describe a process for manufacturing a semiconductor device in accordance with a first embodiment of the present invention.
Figure 2:
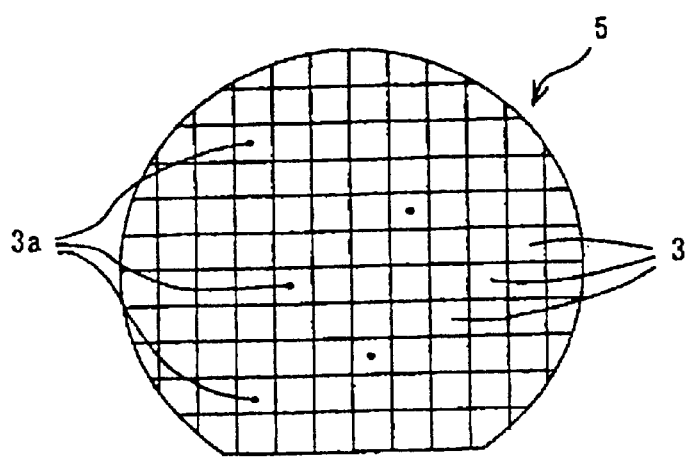
FIG. 2 is a plan view of a semiconductor wafer wherein each of the semiconductor chip forming sections is subject to electrical characteristic examination and bad sections are marked with "BAD" marks, which presents a basis to describe the process for manufacturing a semiconductor device in accordance with the first embodiment of the present invention.
Figure 3:
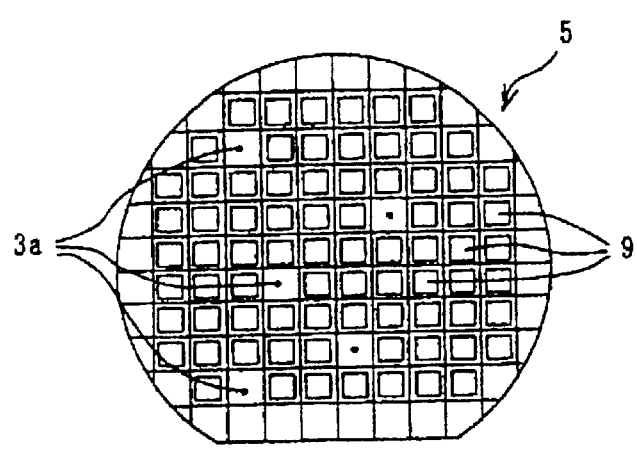
FIG. 3 is a plan view of a semiconductor wafer in a state in which other segmented semiconductor chips are stacked in layers on, and electrically connected to, semiconductor chip forming sections that have been determined to be good products, which presents a basis to describe the process for manufacturing a semiconductor device in accordance with the first embodiment of the present invention.

FIG. 1 through FIG. 3 are plan views of a base semiconductor wafer in a process of manufacturing semiconductor devices in accordance with a first embodiment of the present invention.

Figure 4:
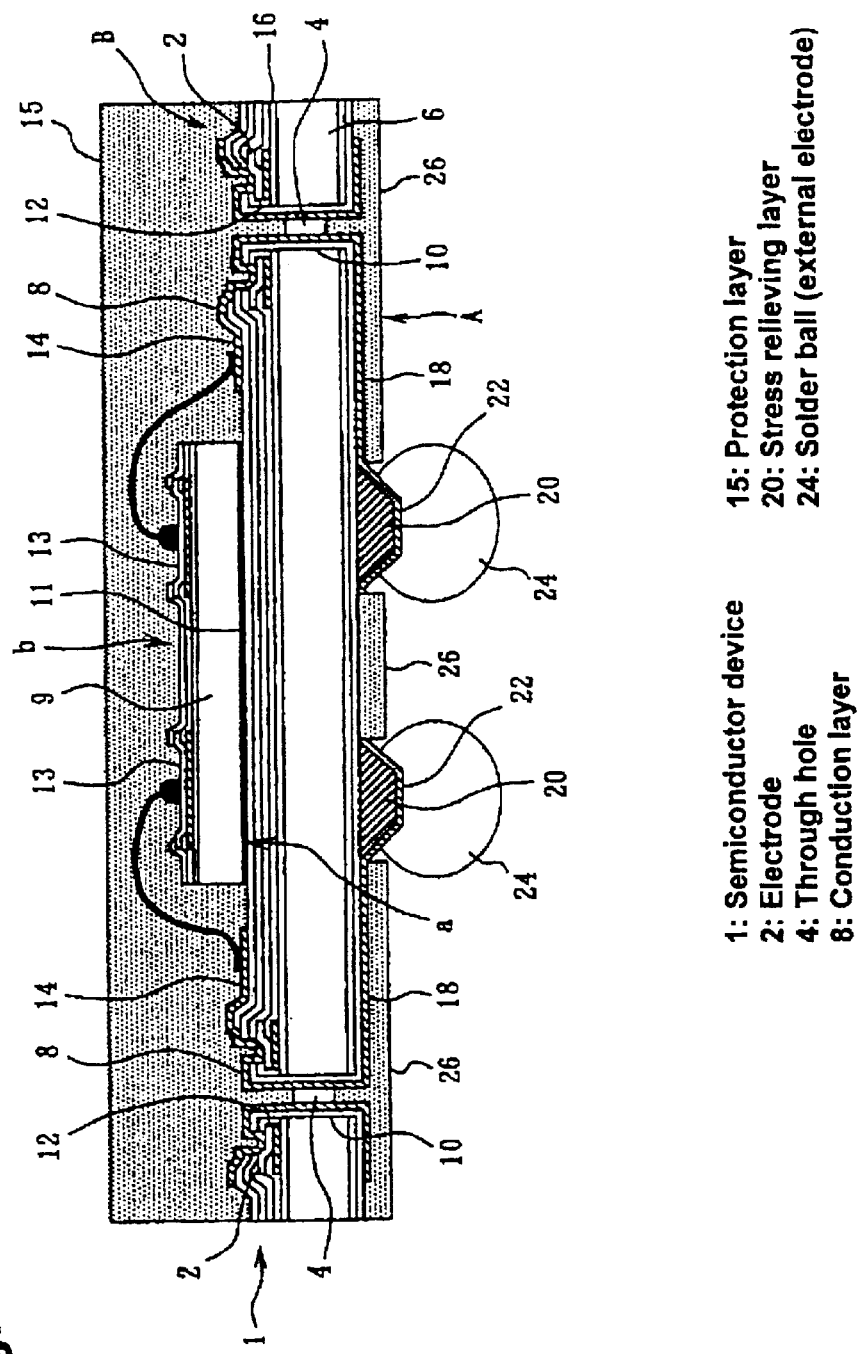
FIG. 4 is an enlarged cross-sectional view of a semiconductor device in accordance with the first embodiment of the present invention.

FIG. 1 shows a state of the wafer having a plurality of semiconductor chip forming sections, FIG. 2 shows a state in which each of the semiconductor chip forming sections is subject to electrical characteristic examination and bad sections are marked with "BAD" marks, and FIG. 3 shows a state in which segmented other semiconductor chips are stacked in layers on, and electrically connected to, those of the semiconductor chip forming sections that are determined to be good products. FIG. 4 is an enlarged cross-sectional view of a semiconductor device in accordance with a first embodiment, which is obtained by cutting the semiconductor chip forming sections shown in FIG. 3 into segments.

The semiconductor device 1 in accordance with the present embodiment is a three-dimensional mount type having a base 6 that is obtained by cutting a good a semiconductor chip forming section 3, selected by an electrical characteristic examination, from a semiconductor wafer 5. The semiconductor device 1 has electrodes 2 and through holes 4 formed therein, stress relieving layers 20 partially formed on one surface (a non-active surface A in this example) of the base 6, conduction layers 8 formed over areas including internal surfaces of the through holes 4 and extending from the electrodes 2 to the stress relieving layers 20, solder balls 24 to serve as external electrodes formed on the conduction layers formed over the stress relieving layers 20, and another segmented semiconductor chip 9 that is stacked in layers and fixed and electrically connected to the other surface (an active surface B in this example) of the base 6.

An aperture 12, which communicates with the through hole 4 via a dielectric film 10, is formed in the electrode 2. The conduction layer 8 is formed in staked layers at least on a part of the electrode 2, and a part thereof defines a connection section 14 that is electrically connected to the exterior. Within the through whole 4, the dielectric film 10 is formed below the conduction layer 8, to thereby shut out the electrical connection to integrated circuits that are formed within the base 6. Further, the conduction layer 8 provides electrical connection between the non-active surface A and the active surface B of the base 6.

The other segmented semiconductor chip 9 is stacked in layers in a manner that a non-active surface a of the semiconductor chip 9 faces the active surface B of the base 6, and is affixed to the active surface B of the base 6 by a die-bond agent 11. Further, electrodes 13 on the active surface b of the chip 9 and electrodes, namely, the connection sections 14 on the active surface B of the base 6, are electrically connected by wire bonding, and the wire bonding sections are covered by a protection layer 15 formed of a resin mold.

The base 6 has a dielectric layer (an interlayer film) 16 on its surface on which an integrated circuit, formed of transistors and memory elements (not shown), are formed. The dielectric film 16 can be made of an oxide film of silicon that is a base material for semiconductor chips. Electrodes (pads) 2 are formed on the dielectric film 16, and the electrodes 2 are electrically connected to the integrated circuit in areas (not shown in the figure). The electrodes 2 can be formed from aluminum. The electrodes 2 are aligned along at least one edge of the surface of the base 6 (in many cases, along two edges or four edges). Also, the electrodes 2 may be arranged at the end section of the surface of the base 6 in one aspect, or in the central section thereof in another aspect.

A part of the conduction layer 8 forms a re-disposing wiring 18 on the non-active surface A, and an end portion of the re-disposing wiring 18 covers the surface of the stress relieving layer 20 that is formed with a resin, such as polyimide, wherein the end portion forms a pedestal 22. The solder balls 24 that serve as external electrodes are formed on the pedestals 22, and areas, except for the solder balls 24, are covered by a solder resist layer 26. The solder resist layer 26 serves as an anti-oxidation film, a protection film when a semiconductor device is finalized, and further a protection film that enhances the moistureproof characteristic.

Next, a method for manufacturing the semiconductor device 1 described above is explained with reference to FIG. 4 based on process illustrations shown in FIG. 1 through FIG. 3 and FIG. 8 through FIG. 11.

Figure 8:
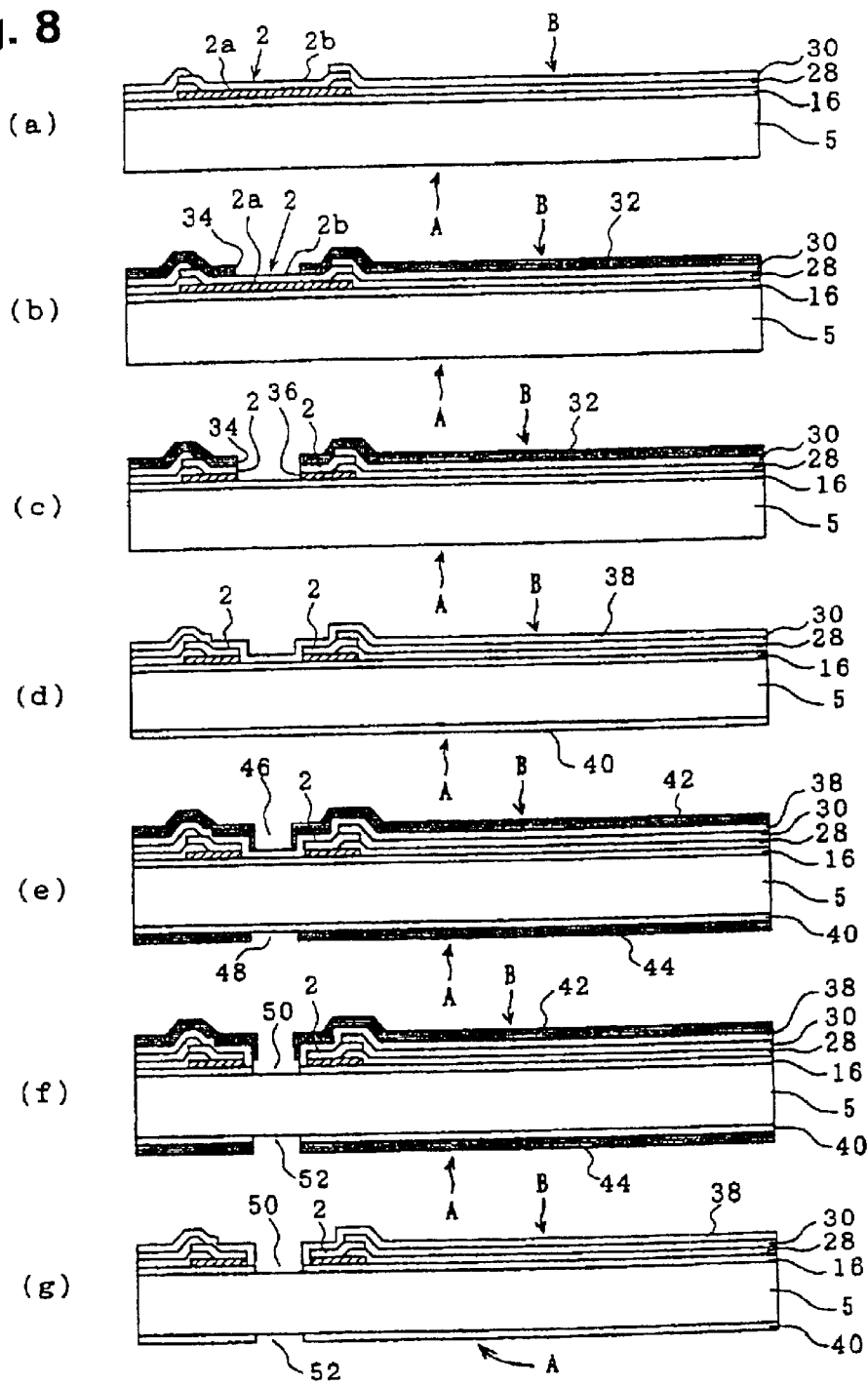
FIGS. 8(a)–8(g) illustrate steps of a method for manufacturing a base of a semiconductor device in accordance with the present invention.

First a process of manufacturing the base 6 is described with reference to FIG. 1 through FIG. 3, and according to FIG. 8(a) through FIG. 11(c). As shown in FIG. 8(a), a dielectric film 16 is formed on the surface of the semiconductor wafer 5 before it is cut into individual segmented bases 6, and a lower layer section 2a of the electrode 2 is formed on the dielectric film 16. Further, a dielectric film 28 is stacked in layers over the lower layer section 2a at an end section of the lower layer section 2a, and an upper layer section 2b of the electrode 2 is formed to extend over the dielectric film 28. Also, a passivation film 30 is formed over an end section of the electrode 2, except for a central area thereof. The passivation film 30 may be formed from, for example, $SiO_2$, SiN, or polyimide resin.

First, a resist 32 is formed over the active surface B of the semiconductor wafer 5 including the electrodes 2, in other words, on the surface in which the electrodes 2 are formed. The resist 32 can be formed by a method, such as a spin-coat method, a dipping method, or a spray coating method. The resist 32 covers portions that are not etched by an etching process to be described below, and may be formed from a photoresist, an electron beam resist, an X-ray resist, or the like, and in a positive type or a negative type. The resist 32 used in the present embodiment is a photoresist of the positive type. The resist 32 is pre-baked to evaporate the solvent, such that the resist 32 does not adhere to other members after coating.

Then, as shown in FIG. 8(b), the resist 32 is patterned. More particularly, a mask is disposed over the resist 32, and energy is irradiated. The energy varies depending on the characteristics of the resist 32, and the energy may be light, an electron beam or x-ray. In the present embodiment, the photoresist 32 is used for exposure. The shape of the mask is determined by the shape of the patterning configuration, and has a reversed shape depending on whether the resist 32 is a positive type or a negative type.

After the exposure, the resist 32 is developed for post-baking. The patterned resist 32 has an opening section 34 formed therein that exposes the central section of the electrode 2.

As shown in FIG. 8(c), the central section of the electrode 2, that is exposed through the opening section 34 in the resist 32, is etched. For the etching, a dry etching may preferably be conducted. The dry etching may be a reactive ion etching (RIE). Also, a wet etching may be employed as the etching. In this manner, a hole 36 is formed in the central section of the electrode 2 (excluding an edge section thereof). The hole 36 is formed at the location where the through hole 4, described above with reference to FIG. 1, is formed. More particularly, the hole 36 is formed to be a size that is generally the same as the size of an opening end section of the through hole 4 or greater, and communicates with the through hole 4.

Then, after the resist 32 is removed, as shown in FIG. 8(d), dielectric films 38 and 40 are formed on one side of the semiconductor wafer 5 where the electrodes 2 are formed (on the side of the active surface B) and on the opposite side (on the side of the non-active surface A), respectively. The dielectric films 38 and 40 may be formed from silicon oxide films or silicon nitride films, and can be formed by chemical vapor deposition (CVD). The dielectric film 38 on the side of the active surface B covers the electrode 2 and the passivation film 30. Since the hole 36 is formed in the electrode 2, the dielectric film 38 also covers the interior of the hole 36 (the internal wall surface and the dielectric film 16 that is exposed).

Then, as shown in FIG. 8(e), resists 42 and 44 are formed respectively on the active surface B and the non-active surface A of the semiconductor wafer 5, then the resists 42 and 44 are patterned, to thereby form opening sections 46 and 48 at locations that become the through hole 42, described above with reference to FIG. 1. The opening section 46 is formed inside the hole 36 of the electrode 2 such that the dielectric film 38 is present between the hole 36 and the opening section 46. Therefore, the opening sections 46 and 48 expose portions of the dielectric films 38 and 40. Formation and patterning of the resists 42 and 44 may be conducted by the methods employed for the resist 32 as described above. One of the resists 42 and 44 (for example, the resist 42) may be formed (for example, on the active surface B of the semiconductor wafer 5) and pre-baked, and then the other (for example, the resist 44) may be formed and pre-baked.

As shown in FIG. 8(f), a hole 50 is formed in the dielectric films 16 and 38 inside the hole 36 of the electrode 2, and a hole 52 is formed in the dielectric film 40.

As shown in FIG. 8(g), the resists 42 and 44 are removed. Then, as shown in FIG. 9(a), portions exposed through the holes 50 and 52 in the semiconductor wafer 5 are etched. The portions that are etched are portions where integrated circuits are not formed, and are formed with silicon. By this etching, recesses 54 and 56, that are visually recognizable, are formed on the surface of the semiconductor wafer 5. The recesses 54 and 56 are not limited to particular shapes, and may have a shape with a taper, or may have a wall surface that is vertical to the surface. For the etching, it is easy to employ a wet etching. However, a dry etching may be employed. The type of etching used determines the shapes of the recesses 54 and 56.

As shown in FIG. 9(b), a small hole 58 (for example, having a diameter of about 20 $\mu$m) is formed in a semiconductor wafer 5. The small hole 58 has a diameter that is smaller than the through hole 4 described above with reference to FIG. 1, and is formed in the center of the through hole 4. The small hole 58 may be formed by using a laser (for example, YAG laser or CO2 laser). The laser beam can be irradiated while recognizing the position of the above-described recesses 54 and 56. The laser beam may be irradiated to one surface of the semiconductor wafer 5 to form the small hole 58, or the laser beam may be irradiated to both sides of the semiconductor wafer (successively or at the same time). Irradiation of the laser beam to the both sides causes less influences on the semiconductor wafer 5.

As shown in FIG. 9(c), a through hole 4 is formed in the semiconductor wafer 5. The through hole 4 is formed by expanding the small hole 58 described above. For example, a wet etching may be employed to etch the internal wall surface of the small hole 58. For example, a mixed solution of hydrofluoric acid and ammonium fluoride (buffered hydrofluoric acid) may be used as an etching liquid.

The through hole 4 in this example is formed to have an aperture cross-section that has generally the same diameter along all portions in the axial direction. However, the through hole may be formed to have a shape having aperture end sections and an intermediate section having a diameter (for example, about 40–50 $\mu$m) greater than the aperture end sections.

In this manner, when the intermediate section of the through hole is provided with a diameter that is as large as possible, CVD and electroless plating described below can be readily conducted. When the through hole 4 is formed in a straight shape as shown in this example, the strength of the semiconductor wafer 5 can be prevented from becoming lessened as a result of the formation of the through hole 4. The through hole 4 can have a taper section that connects the aperture end section and the intermediate section. The taper section can also be formed by expanding the small hole 58 by wet etching.

Then, as shown in FIG. 9(d), a dielectric film 10 is formed at least on the internal wall surface of the through hole 4. The dielectric film 10 may be formed by CVD. The dielectric film 10 may be formed in areas other than the internal wall surface of the through hole 4. For example, the dielectric film 10 may be formed over the dielectric films 38 and 40. However, the dielectric film 10 should not close the aperture of the through hole 4.

Then, as shown in FIG. 9(e), a resist 64 is formed on the side of the active surface B of the semiconductor wafer 5 in a manner to close one of the apertures of the through hole 4 of the semiconductor wafer 5, and then the resist 64 is patterned to form an opening section 68. It is noted that a resist 66 may be formed on the side of the non-active surface A when the resist 64 is formed. Then, the resists 64 and 66 are pre-baked. Formation and patterning of the resists 64 and 66 may be conducted by the methods employed for the resist 32, as described above. The opening section 68 is formed above at least a part of the electrode 2. However, a part of the resist 64 remains above the through hole 4. For example, the opening section 64 is formed in a ring shape between an external periphery of a shape, that is located within the electrode 2, and an internal periphery of a shape that covers at least the opening edge section of the through hole 4. It is noted that the ring shape referred to above may be a square ring shape or a circular ring shape. The opening section 68 exposes a part of the dielectric film 10.

Figure 9:
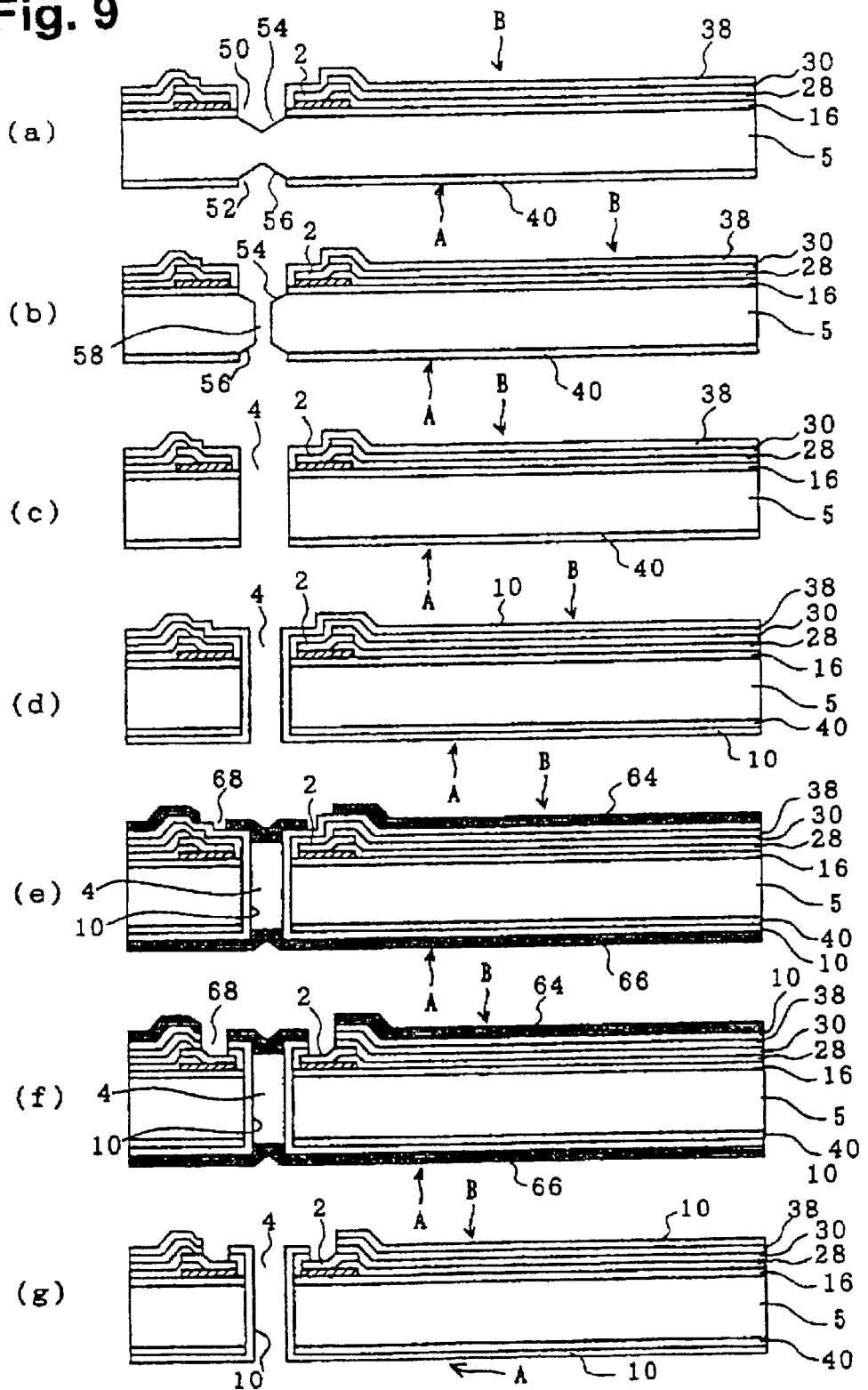
FIGS. 9(a)–9(g) illustrate steps of the method for manufacturing the base of the semiconductor device in accordance with the present invention.

Then, as shown in FIG. 9(*f*), the dielectric films 10 and 38 are etched using the patterned resist 64 as a mask, to thereby expose a part of the electrode 2. The part of the exposed electrode 2 is a portion that is used for electrical connection, and therefore is preferably large. Thereafter, as shown in FIG. 9(*g*), the resists 64 and 66 are removed.

Figure 10:
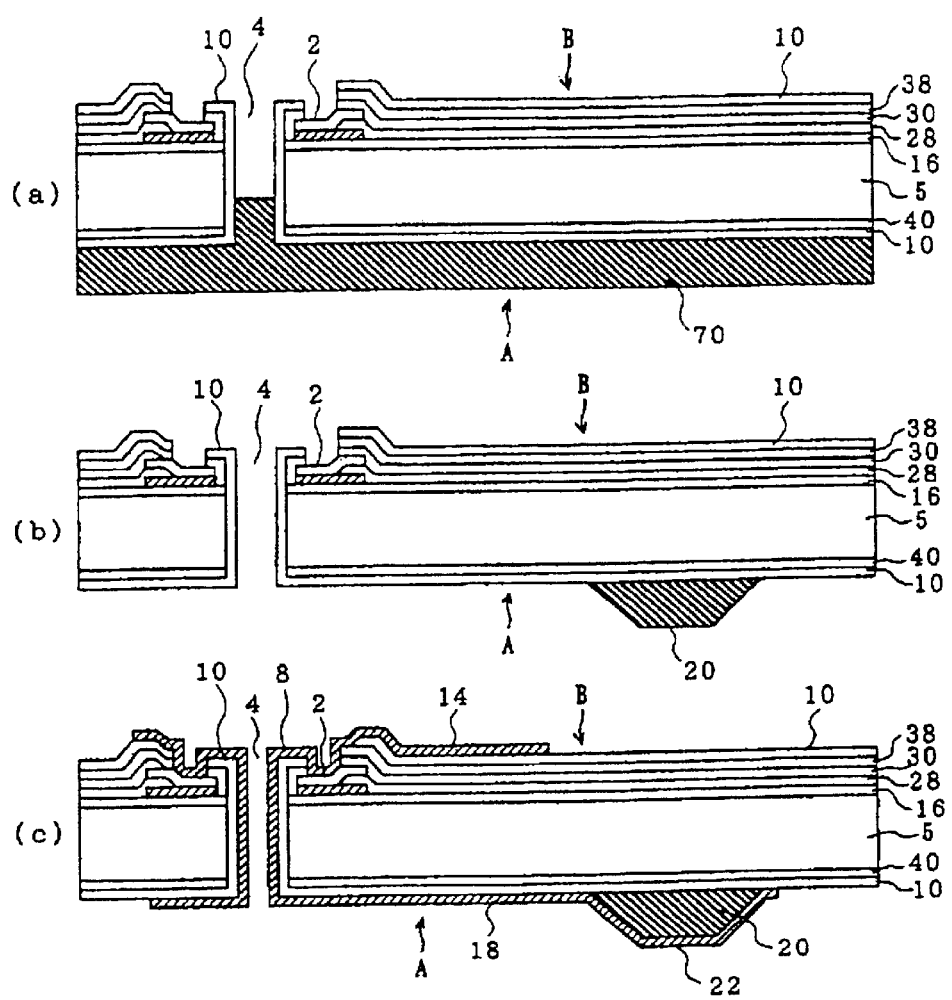
FIGS. 10(a)–10(c) illustrate steps of the method for manufacturing the base of the semiconductor device in accordance with the present invention.
Figure 11:
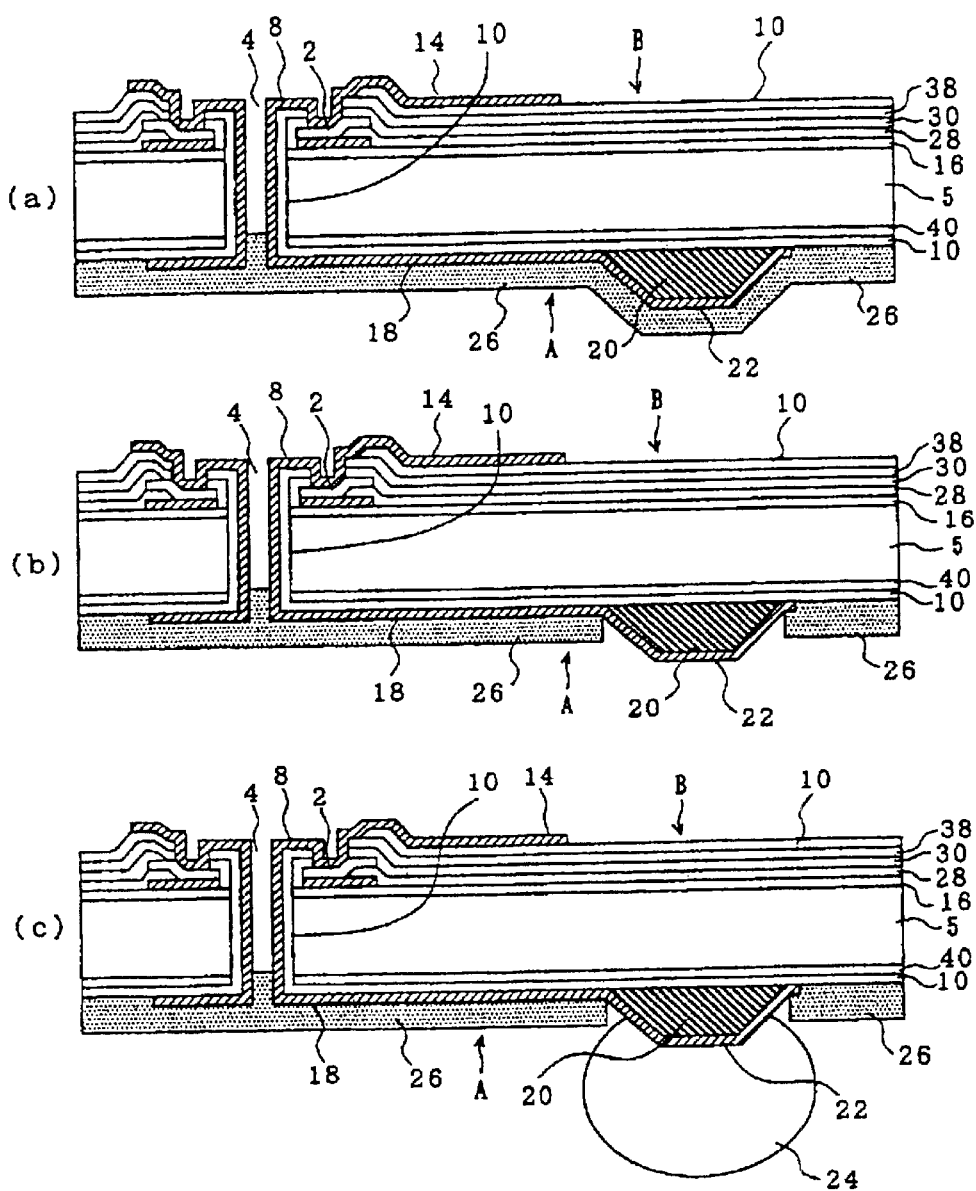
FIGS. 11(a)–11(c) illustrate steps of the method for manufacturing the base of the semiconductor device in accordance with the present invention.

Then, as shown in FIG. 10(*a*), a resin layer 70 is formed on the side of the non-active surface A of the semiconductor wafer 5 by coating a photosensitive polyimide resin (by for example, a "spin coating method"). The resin layer 70 is preferably formed to have a thickness ranging from 1–100 $\mu$m, and more preferably to have a thickness of about 10 $\mu$m. The spin coating method wastes a lot of polyimide resin. Therefore, an apparatus using a pump to extrude polyimide resin in a band shape can be used. As such an apparatus, for example, the one disclosed in U.S. Pat. No. 4,696,885 may be used. The resin layer 70 has a function as the stress relieving layer 20 described above with reference to FIG. 1.

As shown in FIG. 10(*b*), the resin layer 70 is removed by exposure, development and baking processes, while leaving a portion that becomes a pedestal of the re-disposition wiring, in other words, the stress relieving layer 20.

In the description of the example above, a photosensitive polyimide resin is used as a resin that becomes the stressed relieving layer 20. However, a resin that does not have photosensitivity can also be used. For example, a material that has a low Young's modulus ($1 \times 10^{10}$ Pa or lower) when solidified and can function to relieve stresses, such as silicon denatured polyimide resin, epoxy resin, or silicon denatured resin, can be used. When a non-photosensitive resin is used, a photoresist is used thereafter to conduct a photo processing to form a specified shape.

In order to form a conduction layer, resists are formed on the sides of the active surface B and the non-active surface A of the semiconductor wafer 5, then patterned and pre-baked. Then, as shown in FIG. 10(*c*), a conduction layer 8 having an electrical connection section 14 on the side of the active surface B, and the pedestal 22 that covers the surface of the re-disposition wiring 18 and the stress relieving layer 20 on the side of the non-active surface A, is formed. The conduction layer 8 also covers a region including the internal wall surface of the through hole 4 (the surface of the dielectric film 10 within the through hole 4 in this example).

The process of forming the conduction layer 8 is described in further detail. First, resists are formed on the sides of the active surface B and the non-active surface A of the semiconductor wafer 5. Since the resist on the side of active surface B is formed in a region that has a large step difference, it is preferably in the form of a pre-formed film (a dry film).

Then, the resists on the sides of the active surface B and on the non-active surface A of the semiconductor wafer 5 are patterned to thereby form an opening section, that communicates with the through hole 4, and a re-disposition wiring pattern that continues with the opening section. The opening section on the side of the active surface B is formed in a region where the electrical connection section 14 is formed, and exposes a part of the electrode 2.

Then, a catalyst for electroless plating is applied to areas extending from the through hole 4 to the exposed portion in the electrode 2. In this example, palladium is used as the catalyst. The catalyst may be formed in the following manner. For example, the semiconductor wafer 5 is submerged in a mixed solution containing palladium and tin, and then it is processed by an acid, such as hydrochloride, to provide only the palladium. Alternatively, the semiconductor wafer 5 may be submerged in a tin chloride solution to absorb tin ions (reducing agent), and then the semiconductor wafer 5 may be submerged in a palladium chloride solution to reduce palladium ions by the tin ions (reducing agent) to deposit palladium cores (catalyst).

Alternatively, the catalyst may be directly applied by an ink-jet method. According to the ink-jet method, the technologies that have been put to practical use in ink-jet printers can be employed to provide inks economically and at a high-speed without waste. Ink-jet heads have been put to practice, for example, for ink-jet printers. An ink-jet head of a piezo jet type using a piezo element, a bubble jet type using an electrothermal conversion member as an energy generation element, or the like, can be used, and its jetting areas and jetting patterns can be optionally set. As a result, without performing a resist patterning process and a resist removing process, or without performing an etching process when a metal layer is formed over the entire surface, electrical connection sections can be formed.

Then, the resists on the sides of the active surface B and the non-active surface A of the semiconductor wafer 5 are removed.

By removing the resists, a catalyst can be provided only on areas where electric connection sections are to be formed. When the resists are removed, ultraviolet rays may be irradiated, or the resists may be submerged in a weak alkali solution to thereby remove the resists. As a result, the resists can be readily and reliably removed.

In this example, the resists are patterned and a catalyst is provided, and thereafter the resists are removed to thereby expose the catalyst in regions where electrode connection sections are to be formed. However, the invention is not limited to this example. For example, a catalyst may be provided over the entire surface, then the resists can be provided and patterned excluding regions where the control connection sections are formed to thereby expose the catalyst in the regions where the electrical connection sections are formed. In this case, the resists are removed after formation of the electrical connection sections is completed.

Then, the above described conduction layer 8 is formed by an electroless plating in the region where the catalysts is exposed. It is noted that the catalyst is provided on the internal wall surface of the through hole 4 (on the surface of the dielectric film 10 in the example of FIG. 10(*b*)) and on the sides of the active surface B and the non-active surface A of the semiconductor wafer 5. Therefore, the conduction layer 8 is continuously formed between the active surface B side and the non-active surface A side of the semiconductor wafer 5 through the through hole 4. Also, the conduction layer 8 is stacked in layers over the electrode 2.

As a material for the conduction layer 8, any one of Ni, Au, Ni+Au, Cu, Ni+Cu, Ni+Au+Cu can be used. For example, a copper plating solution can be used, and copper ions in the solution can be reduced using palladium that is a catalyst as a core, to thereby deposit copper (the conduction layer 8). As a conduction material for forming the conduction layer 8, a plurality of different metals (for example, Ni+Cu, Ni+Au+Cu) can be used, whereby the conduction layer 8 may be formed in a plurality of layers.

For the electroless plating, a weak alkali copper plating solution can also be used. For the copper plating of weak alkali (about pH9), PB-570 (trade name by EBARA-UDYLITE CO., LTD.) that mixes PB-570MU, PB-570A, PB-570B, PB-570C and PB-570S can be used. Accordingly, since the copper plating solution is weak alkali, damages to the electrode 2 can be reduced even when the electrode 2 is formed of, for example, aluminum.

Alternatively, a conduction layer (not shown in the figures) may be formed on the surface of the electrode 2 to protect the electrode 2, such that a solution of strong alkali can be used. The conduction layer 18 may be in one layer or in a plurality of layers. For example, the conduction layer 8 can be formed in two layers of nickel and gold. The conduction layer 8 may be formed by nickel in the following manner. As a pretreating, the electrode 2 is subject to a zincate process to displace the surface of the aluminum with zinc, and then submerged in an electroless nickel plating solution to deposit nickel through a replacement reaction between the zinc and nickel. Alternatively, the aluminum can be submerged in a palladium solution that is selectively adsorbed onto aluminum, and then submerged in an electroless nickel plating solution to deposit a coating film of nickel with the palladium being as cores. The conduction layer 8 may be formed only with nickel. However, it may be further submerged in an electroless gold plating solution to further form a coating film of gold on the surface of the nickel. By forming the coating film of gold, electrical connection with the conduction layer 8 can be further secured.

The examples described above all relate to a method of forming the conduction layer 8 using a wet method (plating method). However, another forming method that uses, for example, a conventionally practiced dry method (sputtering method or the like), or a method combining a dry method and a wet method, can also be employed.

For the electrical connection section 14 on the active surface B side and the pedestal 22, that becomes to be an electrical connection section on the non-active surface A side, their conduction layers may preferably be thickly formed (for example to a thickness of about 5 μm or greater).

By the processes described above, the conduction layer 8 is formed, a part of the conduction layer 8 forms the re-disposition wiring 18 on the non-active surface A, an end section of the pre-disposition wiring 18 covers the surface of the stress relieving layer 20 that is formed from a resin such as polyimide, and this section becomes the pedestal 22 for forming a solder ball.

Solder balls are formed by the following method. First, a photosensitive solder resist layer 26 is coated on the entire surface of the non-active surface side of the semiconductor wafer 5, as shown in FIG. 11(a).

Then, exposure, development and baking processes are conducted to thereby remove portions of the solder resist layer in regions that cover the pedestal 22, as shown in FIG. 11(b). Thus, the remaining solder resist layer 26 serves as an anti-oxidation film, a protection film when the semiconductor device 1 is finalized (see FIG. 4), and further as a protection film that enhances the moistureproof characteristic.

Then, as shown in FIG. 11(c), a solder ball 24, that becomes an external electrode, is formed on the pedestal 22. In forming the solder ball 24, initially, a thick layer of solder, that becomes the solder ball, is formed on the pedestal 22. The thickness of the solder is determined by the amount of solder corresponding to the ball diameter that is required when the solder ball is later formed. The layer of solder is formed by electrolytic plating or printing. Then, the layer is formed into a ball shape, that is greater than a hemisphere by wet-back, to thereby form the solder ball 24. The wet-back is a method, in which a solder material is provided at a location where an external electrode is formed, and then reflowed to form a generally hemispherical bump.

In the manner described above, the semiconductor wafer 5 that has a plurality of semiconductor chip forming sections 3. In other words, the bases 6 shown in FIG. 1 are obtained. In accordance with the semiconductor chip forming sections 3 of the semiconductor wafer 5 thus formed, when they are cut into segments and finally become semiconductor devices 1 (see FIG. 4), stresses caused by a difference in the expansion coefficient between a circuit substrate (not shown) and the base 6 are alleviated by the stress relieving layer 20 that is formed from a resin.

The semiconductor device 1 is manufactured in the following manner. First, each of the semiconductor chip forming sections 3 of the semiconductor wafer 5, shown in FIG. 1, is subject to electric characteristic examination using an LSI tester and a wafer prober to determine whether it is good or bad. "BAD" marks 3a are noted on bad semiconductor chip forming sections, as shown in FIG. 2. "BAD" marks 3a may be marked by a method using ink or laser, or a wafer map (data representative of good products or bad products stored by a computer).

Then, as shown in FIGS. 3 and 4, another segmented semiconductor chip 9 is stacked in layers only on the active surface B of the semiconductor chip forming section 3 that has been determined as a good product, in a manner that its non-active surface "a" faces the active surface B of the semiconductor chip forming section 3, and affixed by a die-bond agent 11, as shown in FIG. 4. Further, electrodes 13 on the active surface "b" of the other segmented semiconductor chip 9 and the connection sections 14 on the active surface B of the semiconductor chip forming section 3 are electrically connected by wire bonding. Then, a protection layer 15 of a resin mold is formed to protect the wire bonding sections, and the semiconductor wafer 5 is diced along dicing lines, to thereby obtain the semiconductor devices shown in FIG. 4.

In the manner described above, in accordance with the present embodiments, another segmented semiconductor chip 9 is stacked in layers only on and electrically connected to each of the semiconductor chip forming sections 3. In other words, the bases 6 that have been determined as good products. As a result, other segmented semiconductor chips are not stacked in layers on bad semiconductor chip forming sections, such that waste is reduced and the yield is increased.

Also, since the other segmented semiconductor chips 9 are stacked in layers on the semiconductor wafer 5, in the state shown in FIG. 3, before the semiconductor chip forming sections 3 thereof are cut into segments, the manufacturing process is simplified.

Embodiment 2

Figure 5:
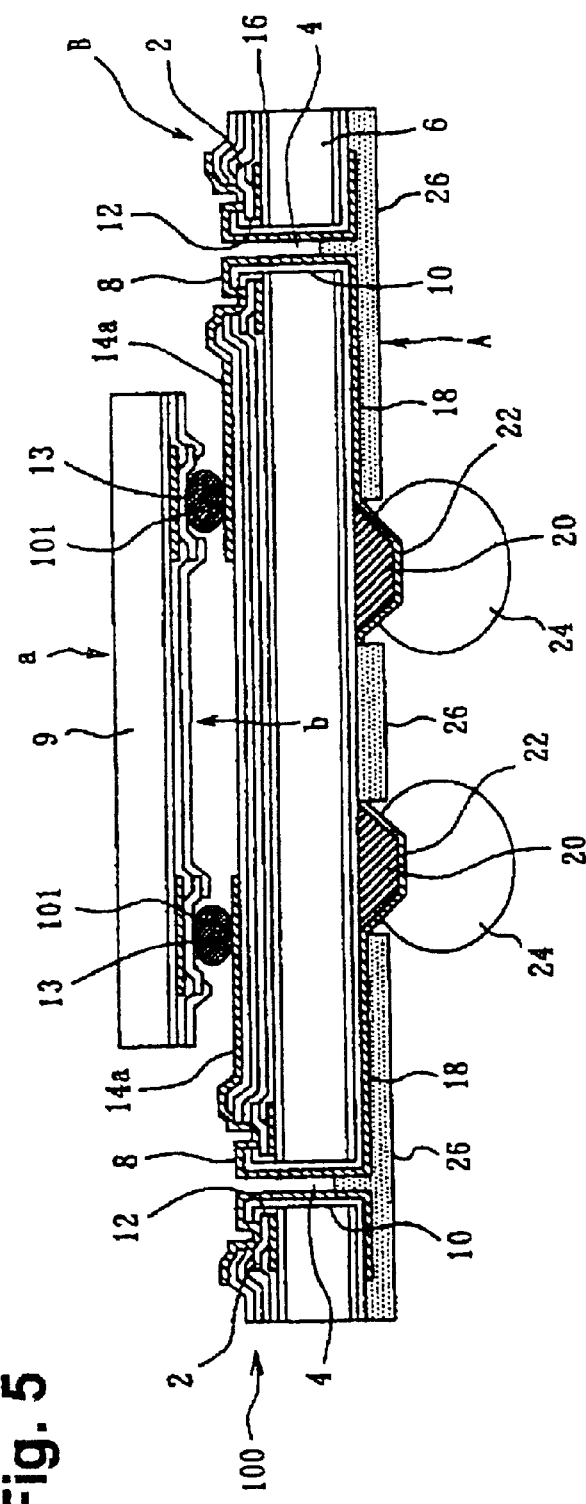
FIG. 5 is an enlarged cross-sectional view of a semiconductor device in accordance with a second embodiment of the present invention.

FIG. 5 is an enlarged cross-sectional view of a semiconductor device in accordance with a second embodiment of the present invention, which is obtained by cutting semiconductor chip forming sections into segments after other segmented semiconductor chips are stacked in layers as shown in FIG. 3. Elements in FIG. 5 that are the same as those of the first embodiment shown in FIG. 4 are referred to with the same reference numbers. It is noted that FIG. 1 through FIG. 3 are referred to for the description.

A semiconductor device 100 in accordance with the present embodiment is also a three-dimensional mount type. Another segmented semiconductor chip 9 is stacked in layers only on the active surface B of the semiconductor chip forming section 3 in the semiconductor wafer 5, which has been determined to be a good product, in a manner that its active surface "b" faces the active surface B of the semiconductor chip forming section 3.

Electrodes 13 on the active surface "b" of the other segmented semiconductor chip 9 and the connection sections 14a that are formed from the re-disposition wirings on the active surface B of the semiconductor chip forming section 3 are electrically connected by bumps 101, respectively. Then, the semiconductor wafer 5 is diced along dicing lines, to thereby obtain the semiconductor devices. For other structures and the process of manufacturing the base 6, the contents described above with reference to FIG. 1 through FIG. 4, and FIG. 8(a) through FIG. 11(c) can be employed.

In accordance with the present embodiment, another segmented semiconductor chip 9 is likewise stacked in layers only on and electrically connected to each of the semiconductor chip forming sections 3 that have been determined to be good products. As a result, other segmented semiconductor chips are not stacked in layers on bad semiconductor chip forming sections, such that waste is reduced and the yield is increased.

Also, an area array type CSP (Chip Scale/Size Package) in which each of the electrodes 13 on the active surface "b" of the other segmented semiconductor chip 9 and the connection sections 14a of the base 6 are electrically connected by the bumps 101, respectively, is employed in a stacked structure. Therefore, in three-dimensional mounting, miniaturization of the inter-electrode pitch is readily achieved, and further miniaturization of circuits and a greater pin number in the package and miniaturization of the package can be achieved.

Also, since the other segmented semiconductor chips 9 are stacked in layers on the semiconductor wafer 5 in the state shown in FIG. 3 before the semiconductor chip forming sections 3 thereof are cut into segments, the manufacturing process is simplified.

Embodiment 3

Figure 6:
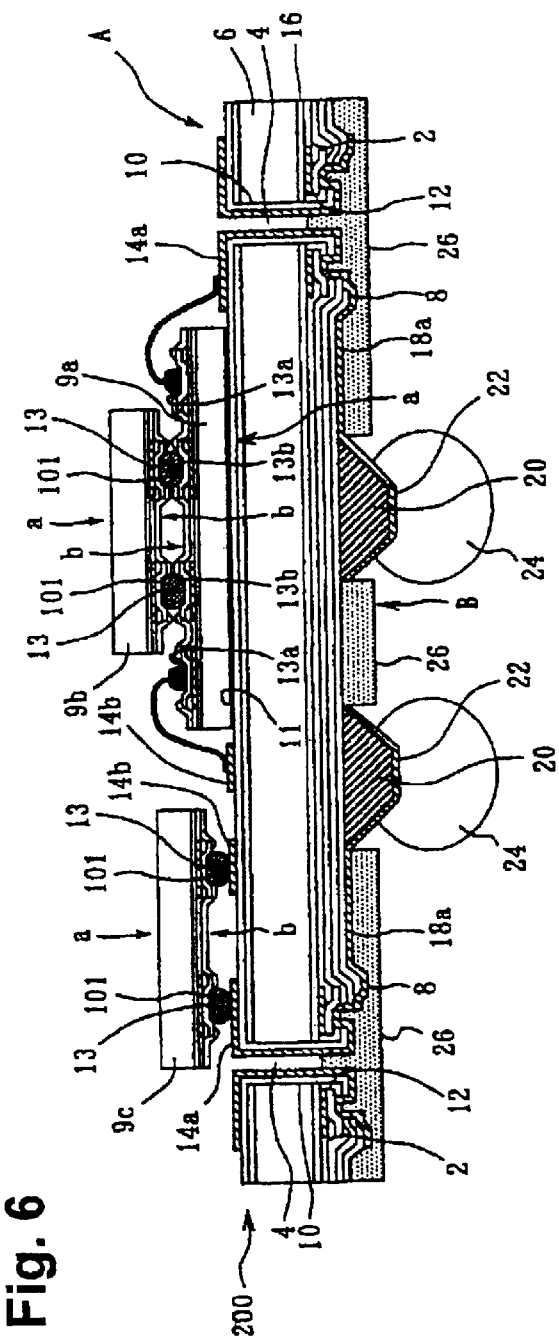
FIG. 6 is an enlarged cross-sectional view of a semiconductor device in accordance with a third embodiment of the present invention.

FIG. 6 is an enlarged cross-sectional view of a semiconductor device in accordance with a third embodiment of the present invention, which is obtained by cutting semiconductor chip forming sections into segments after other segmented semiconductor 11–15, chips are stacked in layers as shown in FIG. 3. Elements in FIG. 6 that are the same as those of the first embodiment, shown in FIG. 4, and those of the second embodiment, shown in FIG. 5, are referred to with the same reference numbers. It is noted that FIG. 1 through FIG. 3 are referred to for the description.

A semiconductor device 200 in accordance with the present embodiment is also a three-dimensional mount type. However, the semiconductor device 200 is different from the first embodiment or the second embodiment in that the stress relieving layers 20, the pedestals 22 formed from the re-disposition wirings 18a, the protection film that is formed from the solder resist layer 26, and the solder balls 24 are formed on the active surface B side of the semiconductor chip forming section 5 of the semiconductor wafer 5, and a plurality of other segmented semiconductor chips 9a, 9b and 9c are stacked in layers within the non-active surface A of the semiconductor chip forming section 3 that has been determined as a good product in the semiconductor wafer 5.

The above is described in greater detail below. A plurality of connections sections 14a and 14b are formed with the re-disposition wirings on the active surface B of the semiconductor chip forming section 3 that has been determined as a good product in the semiconductor wafer 5. The other segmented semiconductor chip 9c, that is similar to the one in the second embodiment described above with reference to FIG. 5, is stacked in layers over the connection sections 14a and 14b that are located on the left side in the figure, in a manner that its active surface "b" faces the non-active surface A of the semiconductor chip forming section 3, and electrically connected by the bumps 101.

Also, the other segmented semiconductor chip 9a, that is similar to the one in the first embodiment described above with reference to FIG. 4, is stacked in layers over the connection sections 14a and 14b that are located on the right side in the figure, in a manner that its non-active surface "a" faces the non-active surface A of the semiconductor chip forming section 3, and affixed by a die-bond agent 11. Also, a plurality of electrodes 13a are provided on both sides of the active surface "b" of the other segmented semiconductor chip 9a, and a plurality of electrodes 13b are provided inside thereof in the active surface "b". The electrodes 13a on the both sides and the connection sections 14a and 14b, that are formed on the right side in the figure on the non-active surface A of the semiconductor chip forming section 3, are electrically connected by wire bonding, respectively.

Furthermore, the still other segmented semiconductor chip 9b is located within the other segmented semiconductor chip 9a over the plurality of electrodes 13b in a manner that its active surface "b" faces the active surface "b" of the semiconductor chip 9a, and the segmented semiconductor chips 9a and 9b are electrically connected to one another by the bumps 101.

Then, after the plural other segmented semiconductor chips 9a, 9b and 9c are stacked in layers on the active surface B of the semiconductor chip forming section 3 of the semiconductor wafer 5, and electrically connected to one another in a manner described above, the semiconductor wafer 5 is diced along dicing lines, to thereby obtain the semiconductor devices 200. For other structures and the process of manufacturing the base 6, the contents described above with reference to FIG. 1 through FIG. 5, and FIG. 8 through FIG. 11 can be employed.

In the manner described above, in accordance with the present embodiment, the plural other segmented semiconductor chips 9a and 9c are stacked in layers on each of the semiconductor chip forming sections 3 that have been determined as good products, within its surface, in other words, within the non-active surface A thereof, then the still another segmented semiconductor chip 9b is stacked in layers on the other segmented semiconductor chip 9a, and they are electrically connected to one another. As a result, other segmented semiconductor chips are not stacked in layers on bad semiconductor chip forming sections, such that waste is reduced, the yield is increased and a higher density mounting can be achieved.

Also, since the other segmented semiconductor chips 9 are stacked in layers on the semiconductor wafer 5 in the state shown in FIG. 3 before the semiconductor chip forming sections 3 thereof are cut into segments, the manufacturing process is simplified.

Embodiment 4

Figure 7:
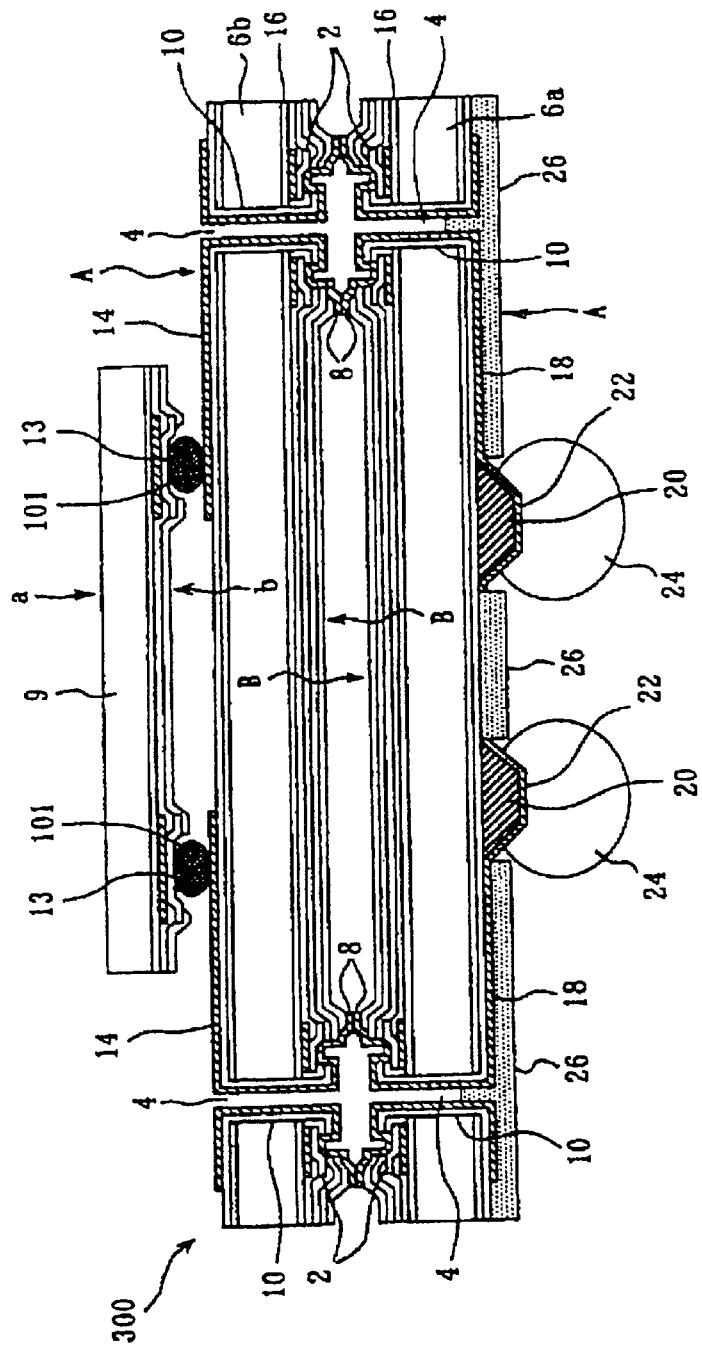
FIG. 7 is an enlarged cross-sectional view of a semiconductor device in accordance with a fourth embodiment of the present invention.

FIG. 7 is an enlarged cross-sectional view of a semiconductor device in accordance with a fourth embodiment of the present invention, which is obtained by cutting semiconductor chip forming sections into segments after other segmented semiconductor chips are stacked in layers, as shown in FIG. 3. Elements in FIG. 7 that are the same as those of the second embodiment shown in FIG. 5 are referred to with the same reference numbers. It is noted that FIG. 1 through FIG. 3 are referred to for the description.

A semiconductor device 300 in accordance with the present embodiment is also a three-dimensional mount type, wherein another semiconductor chip 6b, that has been determined to be a good product in a second semiconductor wafer, is stacked in layers only on the active surface B of the semiconductor chip forming section 3, that has been determined to be a good product in the semiconductor wafer 5, which eventually becomes the base 6a, in a manner that its active surface B faces the active surface B of the semiconductor chip forming section 3. A still another segmented semiconductor chip 9 is stacked in layers on the non-active surface A of the other segmented semiconductor chip 6b in a manner that its active surface "b" faces the non-active surface A of the semiconductor chip 6b. Electrodes 13 on the active surface "b" of the segmented semiconductor chip 9 and the connection sections 14 that are formed from the re-disposition wirings on the non-active surface A of the segmented semiconductor chip are electrically connected by bumps 101, respectively. And then, the semiconductor wafer 5 is diced along dicing lines, to thereby obtain the semiconductor device.

The other semiconductor chip 6b, that is formed of a good segmented product in the second semiconductor wafer, has a structure which includes through holes 4 and electrical connection sections 14 formed in part with the conduction layer 8 including the internal wall surfaces of the through holes 4, which are similar to those of the semiconductor chip forming section 3, but does not have stress relieving layers. The conduction layers 8 on the side of the active surface B of the semiconductor chip forming section 3 of the semiconductor wafer 5, and the conduction layers 8 on the side of the active surface B of the other segmented semiconductor chip 6b, are stacked on top of the other and metal-bonded together by applying pressure and heat. It is noted that the other semiconductor chip 6b in one layer, that is formed of a good segmented product taken from the second semiconductor wafer, is stacked on the semiconductor chip forming section 3 in this embodiment. However, without being limited to this embodiment, two or more layers can be stacked in layers. In any of these aspects, mutual electrical connection is readily attained by the conduction layers 8 that include the internal wall surface of the through holes 4. For other structures and the process of manufacturing the base 6, the contents described above with reference to FIG. 1 through FIG. 4, and FIG. 8 through FIG. 11 can be employed.

In the manner described above, in accordance with the present embodiment, other semiconductor chips 6b and 9 are stacked in layers only on each of the semiconductor chip forming sections 3 that have been determined as good products in the semiconductor wafer 5, and they are electrically connected to one another. As a result, the other segmented semiconductor chips 6a and 9 are not stacked in layers on bad semiconductor chip forming sections, such that waste is reduced, the yield is increased and a higher density mounting can be achieved.

Also, since the other segmented semiconductor chips 9 are stacked in layers on the semiconductor wafer 5, in the state shown in FIG. 3, before the semiconductor chip forming sections 3 thereof are cut into segments, the manufacturing process is simplified.

In the example described above in the fourth embodiment, external electrodes having stress relieving layers 20, in other words, solder balls 24, are formed on the non-active surface A of the base 6a, the other semiconductor chip 6b, that is formed of a good segmented product in the second semiconductor wafer, is stacked in layers on the active surface B of the base 6a with its active surface B facing the active surface B of the base 6a, and the still another semiconductor chip 9 is stacked on the non-active surface A of the other segmented semiconductor chip 6b. However, without being limited to this example, many modifications can be made as follows.

External electrode having stress relieving layers, in other words, solder balls, may be formed on the non-active surface of the base, another semiconductor chip, that is formed of a good segmented product in the second semiconductor wafer, is stacked in layers on the active surface of the base with its non-active surface facing the active surface of the base, and still another segmented semiconductor chip is stacked in layers on the active surface of the other segmented semiconductor chip.

External electrodes having stress relieving layers, in other words, solder balls, may be formed while avoiding at least part of the electrodes on the active surface of the base, another semiconductor chip, that is formed of a good segmented product in the second semiconductor wafer, is stacked in layers on the non-active surface of the base with its active surface facing the non-active surface of the base, and still another segmented semiconductor chip is stacked in layers on the active surface of the other segmented semiconductor chip.

External electrodes having stress relieving layers, in other words, solder balls, may be formed while avoiding at least part of the electrodes on the active surface of the base, another semiconductor chip, that is formed of a good segmented product in the second semiconductor wafer, is stacked in layers on the non-active surface of the base with its non-active surface facing the non-active surface of the base, and still another segmented semiconductor chip is stacked in layers on the active surface of the other segmented semiconductor chip.

Also, in the example described above in the fourth embodiment, the active surface "b" of the other segmented semiconductor chip 9 is laid over the other semiconductor chip 6b that is formed of a good segmented product in the second semiconductor wafer, and they are electrically connected to one another by the bumps 101. However, without being limited to this example, for example, a non-active surface of another segmented semiconductor chip may be affixed to another semiconductor chip, that is formed of a good segmented product taken from a second semiconductor wafer by a die-bond agent, and electrodes on an active surface of the other segmented semiconductor chip and electrodes on the side of the other semiconductor chip, that is formed of the good segmented product taken from the second semiconductor wafer, are connected to one another by wiring bondings, and a protection layer to protect the wiring bonding sections may be provided.

Also, within a surface of another semiconductor chip, that is formed of a good segmented product taken from a second semiconductor wafer, a plurality of other segmented semiconductor chips may be stacked in layers in a manner described above with reference to FIG. 6, and still other segmented semiconductor chips may be stacked in multiple layers to form a stacked structure.

In the manner described above, in accordance with the present invention, a semiconductor wafer, which is equipped with a plurality of semiconductor chip forming sections, is prepared, an electrical characteristic examination is conducted for each of the semiconductor chip forming sections to determine good product sections or bad product sections, and at least another segmented semiconductor chip is electrically connected to each of the semiconductor chip forming sections that are determined to be good product sections. As a result, other segmented semiconductor chips are not stacked in layers on bad semiconductor chip forming sections, with the result that waste is reduced and the yield is increased. Also, since the other segmented semiconductor chips are stacked in layers on the semiconductor wafer before the semiconductor chip forming sections thereof are cut into segments, the manufacturing process is simplified.

What is claimed is:

1. A method for manufacturing a semiconductor device, comprising the steps of:

preparing a semiconductor wafer equipped with a plurality of semiconductor chip forming sections;

conducting an electrical characteristic examination for each of the semiconductor chip forming sections to determine good product sections or bad product sections; and electrically connecting at least another segmented semiconductor chip to each of the semiconductor chip forming sections that are determined to be good product sections only.

2. The method for manufacturing a semiconductor device according to claim 1, further including the steps of previously subjecting the at least another segmented semiconductor chip to an electrical characteristic examination, and determining the other segmented semiconductor chip to be a semiconductor chip of a good product.

3. The method for manufacturing a semiconductor device according to claim 1, the step of electrically connecting at least another segmented semiconductor chip to each of the semiconductor chip forming sections that are determined to be good product sections being conducted by wire bonding.

4. The method for manufacturing a semiconductor device according to claim 1, the step of electrically connecting at least another segmented semiconductor chip to each of the semiconductor chip forming sections that are determined to be good product sections being conducted by face-down bonding.

5. The method for manufacturing a semiconductor device according to claim 1, the step of electrically connecting at least another segmented semiconductor chip to each of the semiconductor chip forming sections that are determined to be good product sections includes:

preparing two or more other segmented semiconductor chips, conducting the electrical connection of the at least another segmented semiconductor chip by wire bonding, and conducting the electrical connection of the other remaining segmented semiconductor chips by face-down bonding.

6. The method for manufacturing a semiconductor device according to claim 1, further including, after electrically connecting the segmented other semiconductor chips to the respective semiconductor chip forming sections, the step of protecting at least connecting sections between the other segmented semiconductor chips and the respective semiconductor chip forming sections with a resin mold.

7. the method for manufacturing a semiconductor device according to claim 1, further including the step of cutting the semiconductor wafer in which the segmented semiconductor chips are electrically connected into segments for the respective semiconductor chip forming sections.

8. A method for manufacturing a semiconductor device, comprising the steps of:

preparing a semiconductor wafer equipped with a plurality of semiconductor chip forming sections having electrodes;

forming a through hole in each of the semiconductor chip forming sections, and forming a conduction layer that extends via the through hole from at least one surface of the semiconductor chip forming sections on which the electrodes are formed to the other surface opposing to the one surface;

conducting an electrical characteristic examination for each of the semiconductor chip forming sections to determine good product sections or bad product sections; and electrically connecting at least another segmented semiconductor chip to each of the semiconductor chip forming sections that are determined to be good product sections only.

9. The method for manufacturing a semiconductor device according to claim 8, further including the steps of previously subjecting the at least another segmented semiconductor chip to an electrical characteristic examination, and determining the other segmented semiconductor chip to be a semiconductor chip of a good product.

10. The method for manufacturing a semiconductor device according to claim 8, the step of electrically connecting at least another segmented semiconductor chip to each of the semiconductor chip forming sections that are determined to be good product sections being conducted by wire bonding.

11. The method for manufacturing a semiconductor device according to claim 8, the step of electrically connecting at least another segmented semiconductor chip to each of the semiconductor chip forming sections that are determined to be good product sections being conducted by face-down bonding.

12. The method for manufacturing a semiconductor device according to claim 8, the step of electrically connecting at least another segmented semiconductor chip to each of the semiconductor chip forming sections that are determined to be good product sections includes:

preparing two or more other segmented semiconductor chips, conducting the electrical connection of the at least another segmented semiconductor chip by wire bonding, and conducting the electrical connection of the other remaining segmented semiconductor chips by face-down bonding.

13. The method for manufacturing a semiconductor device according to claim 10, further including, after electrically connecting the segmented other semiconductor chips to the respective semiconductor chip forming sections, the step of protecting connecting sections between the other segmented semiconductor chips and the respective semiconductor chip forming sections with a resin mold.

14. The method for manufacturing a semiconductor device according to claim 8, further including the step of cutting the semiconductor wafer in which the segmented semiconductor chips are electrically connected into segments for the respective semiconductor chip forming sections.

15. The method for manufacturing a semiconductor device according to claim 8, further including, after a stress relieving layer is formed on at least one surface of the semiconductor chip forming sections, the step of forming the conduction layer over the stress-relieving layers.

16. The method for manufacturing a semiconductor device according to claim 8, further including the step of forming external electrodes on the conduction layers in the semiconductor chip forming sections.

* * * * *